(12) United States Patent
Iwashige et al.

(10) Patent No.: US 11,101,246 B2
(45) Date of Patent: Aug. 24, 2021

(54) SEMICONDUCTOR DEVICE HAVING CHIPS ATTACHED TO SUPPORT MEMBERS THROUGH SILVER SINTERED BODIES WITH PARTICLES

(71) Applicant: DENSO CORPORATION, Kariya (JP)

(72) Inventors: Tomohito Iwashige, Kariya (JP); Takeshi Endo, Kariya (JP); Kazuhiko Sugiura, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/823,402

(22) Filed: Mar. 19, 2020

(65) Prior Publication Data
US 2020/0312818 A1 Oct. 1, 2020

(30) Foreign Application Priority Data
Mar. 26, 2019 (JP) .............................. JP2019-058616

(51) Int. Cl.
*H01L 23/495* (2006.01)
*H01L 23/34* (2006.01)
*H01L 23/48* (2006.01)
*H01L 21/00* (2006.01)
*H05K 7/20* (2006.01)
(Continued)

(52) U.S. Cl.
CPC ........ *H01L 25/072* (2013.01); *H01L 21/4871* (2013.01); *H01L 23/3107* (2013.01); *H01L 23/367* (2013.01); *H01L 23/49568* (2013.01); *H01L 24/29* (2013.01); *H01L 24/83* (2013.01); *H01L 25/50* (2013.01); *H01L 2224/29139* (2013.01); *H01L 2224/8384* (2013.01); *H01L 2224/83444* (2013.01); *H01L 2224/83455* (2013.01); *H01L 2224/83457* (2013.01); *H01L 2224/83484* (2013.01)

(58) Field of Classification Search
CPC ............... H01L 23/3107; H01L 23/495; H01L 23/49568; H01L 23/367; H01L 24/29; H01L 24/83; H01L 25/072; H01L 21/4871; H01L 25/50
See application file for complete search history.

(56) References Cited

U.S. PATENT DOCUMENTS 7,405,107 B2 * 7/2008 Nakazawa ............... H01L 24/32
438/124
2005/0167802 A1 * 8/2005 Hirano ..................... H01L 24/32
257/678

(Continued)

OTHER PUBLICATIONS

Tomohito Iwashige et al. "Metallization Technology of SiC Power Module in High Temperature Operation". 2017.

*Primary Examiner* — Alonzo Chambliss
(74) *Attorney, Agent, or Firm* — Posz Law Group, PLC

(57) ABSTRACT

In a semiconductor device, a first semiconductor chip and a second semiconductor chip are disposed between a first support member and a second support member. A first underlayer bonding material is disposed between the first semiconductor chip and the first support member. A second underlayer bonding material is disposed between the second semiconductor chip and the first support member. A first upper layer bonding material is disposed between the first semiconductor chip and the second support member. A second upper layer bonding material is disposed between the second semiconductor chip and the second support member.

7 Claims, 4 Drawing Sheets

(51) Int. Cl.
*H01L 25/07* (2006.01)
*H01L 23/00* (2006.01)
*H01L 23/367* (2006.01)
*H01L 21/48* (2006.01)
*H01L 25/00* (2006.01)
*H01L 23/31* (2006.01)

(56) References Cited

U.S. PATENT DOCUMENTS

| | | | |
|---|---|---|---|
| 2008/0122063 A1* | 5/2008 | Akiba | H01L 23/49524 257/691 |
| 2016/0005676 A1* | 1/2016 | Orimoto | H01L 23/3107 257/714 |
| 2019/0198441 A1 | 6/2019 | Iwashige et al. | |

* cited by examiner

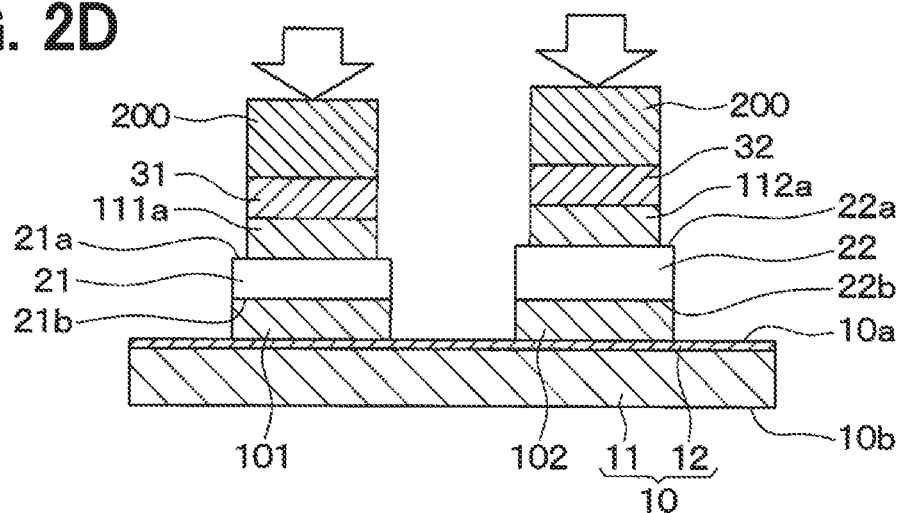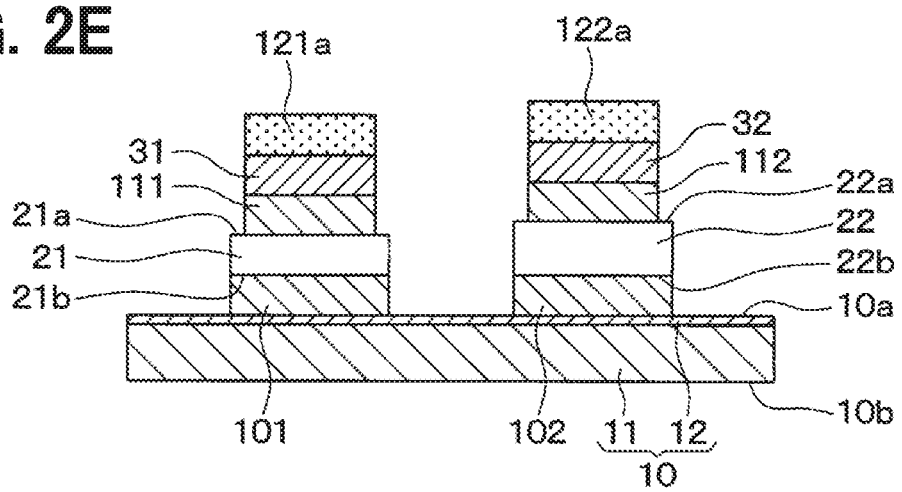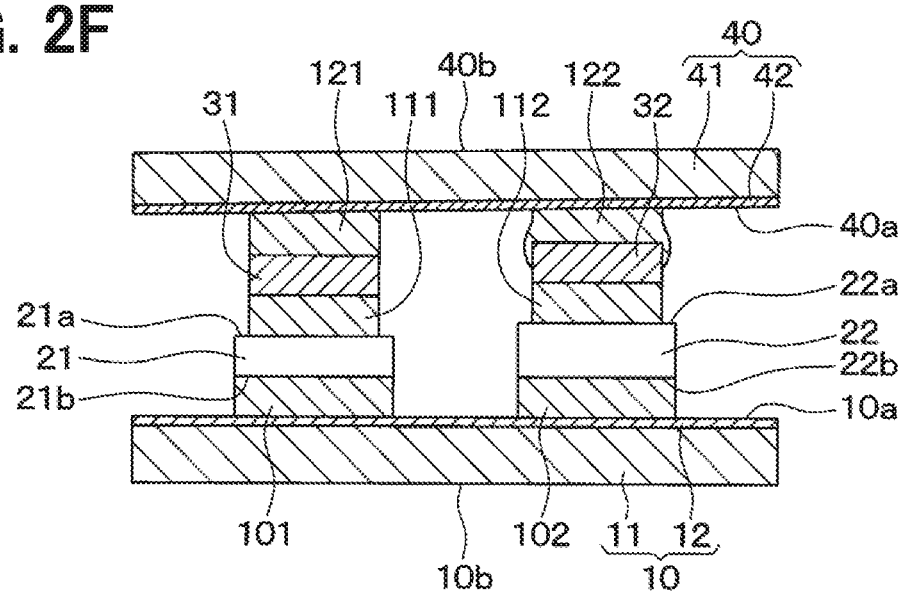

SEMICONDUCTOR DEVICE HAVING CHIPS ATTACHED TO SUPPORT MEMBERS THROUGH SILVER SINTERED BODIES WITH PARTICLES

CROSS REFERENCE TO RELATED APPLICATION

This application is based on Japanese Patent Application No. 2019-58616 filed on Mar. 26, 2019, the disclosure of which is incorporated herein by reference.

TECHNICAL FIELD

The present disclosure relates to a semiconductor device having a first semiconductor chip and a second semiconductor chip between a first support member and a second support member, and a method for producing the same.

BACKGROUND

There is a semiconductor device in which a first semiconductor chip and a second semiconductor chip are arranged between a first support member and a second support member, and these components are encapsulated with a molded resin. In such a semiconductor device, a first underlayer bonding member may be disposed between the first support member and the first semiconductor chip, and a second underlayer bonding member may be disposed between the first support member and the second semiconductor chip. Further, a first upper layer bonding member may be disposed between the second support member and the first semiconductor chip, and a second upper layer bonding member may be disposed between the second support member and the second semiconductor chip. The molded resin may be disposed to encapsulate the first support member, the second support member, the first semiconductor chip, the second semiconductor chip, the first underlayer bonding material, the second underlayer bonding material, the first upper layer bonding material and the second upper layer bonding material.

SUMMARY

The present disclosure provides a semiconductor device including a first support member, a second support member facing the first support member, a first semiconductor chip and a second semiconductor chip, and a method for producing the semiconductor device. The first semiconductor chip and the second semiconductor chip are disposed between the first support member and the second support member. A first underlayer bonding material is disposed between the first semiconductor chip and the first support member. A second underlayer bonding material is disposed between the second semiconductor chip and the first support member. A first upper layer bonding material is disposed between the first semiconductor chip and the second support member. A second upper layer bonding material is disposed between the second semiconductor chip and the second support member.

BRIEF DESCRIPTION OF THE DRAWINGS

Objects, features and advantages of the present disclosure will become more apparent from the following detailed description made with reference to the accompanying drawings, in which:

FIG. 2D is a diagram illustrating a cross-sectional view of a production step subsequent to the step shown in FIG. 2O;

FIG. 2E is a diagram illustrating a cross-sectional view of a production step subsequent to the step shown in FIG. 2D;

FIG. 2F is a diagram illustrating a cross-sectional view of a production step subsequent to the step shown in FIG. 2E;

DETAILED DESCRIPTION

Figure 1:
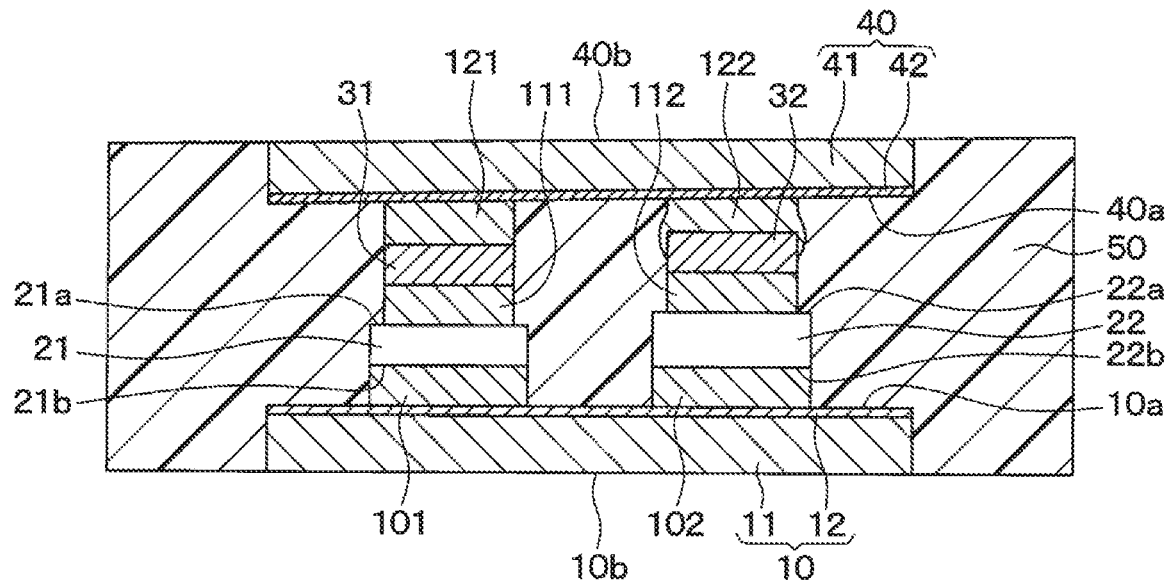
FIG. 1 is a diagram illustrating a cross-sectional view of a semiconductor device according to a first embodiment of the present disclosure.

In a semiconductor device in which a first semiconductor chip and a second semiconductor chip are arranged between a first support member and a second support member through first and second underlayer bonding members and first and second upper layer bonding members, and are encapsulated with a molded resin, the first and second underlayer bonding materials and the first and second upper layer bonding members may be respectively provided by a silver (Ag) sintered body, which is produced by sintering Ag. Each of the first support member and the second support member may have a nickel gold (NiAu) plating film on a surface to be bonded with the corresponding bonding member.

Such a semiconductor device may be produced as follows. First, a first underlayer Ag paste and a second underlayer Ag paste, as Ag sintering materials, are placed on the first support member, and then the first semiconductor chip and the second semiconductor chip are placed thereon, thereby to form a stacked body. Next, the stacked body of the first and second semiconductor chips and the first support member through the first and second underlayer Ag pastes is pressurized and heated so as to form the first and second underlayer Ag pastes into the first and second underlayer bonding members, and so as to bond the first and second semiconductor chips to the first support member with the first and second underlayer bonding members. Next, a first upper layer Ag paste is placed on the first semiconductor chip and a second upper layer Ag paste is disposed on the second semiconductor chip. Further, the second support member is placed on the first and second upper layer Ag pastes. Then, the stacked body is pressurized and heated so as to form the first and second upper layer Ag pastes into the first and second upper layer bonding members, and so as to bond the second support member to the first and second semiconductor chip with the first and second upper layer bonding members. Thereafter, the molded resin is formed, as described above.

In such a case, however, the first semiconductor chip and the second semiconductor chip may have different thicknesses. Also, a region including the first semiconductor chip and a region including the second semiconductor chip may have different heights due to parts tolerance. As a result, the second support member may be tilted relative to the first support member, when being placed thereon. In such a situation, when the first and second upper layer Ag pastes are sintered by pressurizing and heating, one of the first semiconductor chip and the second semiconductor chip may receive excessive pressure, resulting in breakage of the one of the first semiconductor chip and the second semiconductor chip.

To address such an issue, it may be conceivable to use a cobalt tungsten (CoW) plating film, as an example of a plating film that can achieve a sufficient bonding property with the Ag sintered body, even without pressurizing. Namely, in a semiconductor device using the CoW film as the plating film, the bonding property between the plating film and respective bonding members can be enhanced, without requiring the pressurizing of the Ag paste.

The inventors of the present disclosure has further studies and found, in the semiconductor device using the CoW plating film, that Co of the CoW plating film is oxidized through multiple thermal steps performed during the production of the semiconductor device, resulting in degradation of the bonding property with the Ag sintered body. Namely, in the case where the CoW plating film is used as the plating film, the plating film on the first support member is subjected also to the thermal step for sintering the Ag paste between the second support member and the semiconductor chips, and thus Co of the CoW plating film is oxidized. As a result, it is assumed that the bonding property of the plating film with the Ag sintered body will be degraded.

In a case where the first semiconductor chip and the second semiconductor chip have different thicknesses, it may be conceivable to hold the second support member to be parallel with the first support member with a jig and to perform the pressurizing and heating in the state where the second support member is held parallel with the first support member. In this case, the thickness of the first upper layer Ag paste between the first semiconductor chip and the second support member is different from the thickness of the second upper layer Ag paste between the second semiconductor chip and the second support member. Therefore, even when the pressurizing is performed to form the first and second upper layer bonding members in the state where the second support member is held parallel with the first support member, an excess pressure may be applied to one of the first semiconductor chip and the second semiconductor chip, resulting in breakage in the one of the first semiconductor chip and the second semiconductor chip.

The present disclosure provides a semiconductor device, which is capable of enhancing the bonding property with an Ag sintered body while suppressing breakage of a semiconductor chip, and a method for producing the same.

In an aspect of the present disclosure, a semiconductor device may include a first support member, a second support member, a first semiconductor chip, a second semiconductor chip, a first underlayer bonding member, a second underlayer bonding member, a first upper layer bonding member, and a second upper layer bonding member. The first support member and the second support member may be opposed to each other. The first semiconductor chip and the second semiconductor chip may be disposed between the first support member and the second support member. The first underlayer bonding member may be disposed between the first support member and the first semiconductor chip, and the second underlayer bonding member may be disposed between the first support member and the second semiconductor chip. The first upper layer bonding member may be disposed between the second support member and the first semiconductor chip, and the second upper layer bonding member may be disposed between the second support member and the second semiconductor chip. The first and second underlayer bonding members and the first and second upper layer bonding member may be each provided by an Ag sintered body. The second support member may have an opposing surface opposing to the first support member. The opposing surface of the second support member may be provided by a plating film that contains CoW as a main component and may be bonded to the first and second upper layer bonding members. The first and second underlayer bonding members may each have smaller gaps between adjacent particles forming the Ag sintered body than that of the first and second upper layer bonding members.

In the above configuration, the first support member may be bonded to the first and second underlayer bonding members that have the smaller gaps in particles of the Ag sintered body. That is, the first support member may be bonded to the pressurized sintered body. Therefore, the bonding property between the first support member and the first and second underlayer bonding members can be enhanced. In addition, the second support member may have the plating film on the surface, and the plating film contains CoW, as a main component, which has high bonding property with the Ag sintered body. Therefore, the bonding property between the second support member and the first and second upper layer bonding members can be enhanced.

In the first and second upper layer bonding members, gaps between adjacent particles of the sintered body may be larger in size than those of the first and second lower layer bonding members. In other words, the first and second upper layer bonding members may be lower-pressurized sintered bodies that have been sintered with a pressure lower than that of the first and second underlayer bonding members. Therefore, as compared with a configuration where the first and second upper layer bonding members have the same structure as the first and second lower layer bonding members, it is less likely that one of the first semiconductor chip and the second semiconductor chip will be applied with pressure largely. As a result, breakage of the one of the first semiconductor chip and the second semiconductor chip will be suppressed.

In a second aspect of the present disclosure, a method for producing a semiconductor device may include: preparing a first support member having a surface; placing a first underlayer Ag sintering material and a second underlayer Ag sintering material on the surface of the first support member; placing the first semiconductor chip and the second semiconductor chip on the surface of the first support member, respectively, through the first underlayer Ag sintering material and the second underlayer Ag sintering material; forming an underlayer bonding member, by heating and pressurizing, the underlayer bonding member including a first underlayer bonding member, which is made from the first underlayer Ag sintering material and bonded to the first support member, and a second underlayer bonding member, which is made from the second underlayer Ag sintering material and bonded to the first support member; placing a first upper layer Ag sintering material and a second upper layer Ag sintering material, respectively, on the first semiconductor chip and the second semiconductor chip; preparing a second support member having a surface; placing the second support member such that the surface of the second support member is in contact with the first upper layer Ag sintering material and the second upper layer Ag sintering material; and forming an upper layer bonding member including a first upper layer bonding member, which is made from the first upper layer Ag sintering material and is bonded to the second support member, and a second upper layer bonding member, which is made from the second upper layer Ag sintering material and is bonded to the second support member.

In the preparing of the second support member, the second support member in which the surface is provided by a plating film containing CoW as a main component may be prepared. The forming of the upper layer bonding member may include heating and applying a pressure that is lower than a pressure applied in the forming of the underlayer bonding member by heating and pressurizing.

In the method described above, the first and second underlayer bonding members, which are produced by the heating and pressurizing, may be bonded to the first support member. Therefore, the bonding property between the first support member and the first and second underlayer bonding members can be enhanced. The second support member may have the plating film containing CoW, which has a high bonding property with the Ag sintered body, and the plating film may be bonded to the first and second upper layer bonding members. Therefore, the bonding property between the second support member and the first and second upper layer bonding members will be enhanced.

In the forming of the first and second upper layer bonding members, the pressure lower than that applied in the forming of the first and second underlayer bonding members may be applied. Therefore, as compared with a method where the first and second upper layer bonding members are formed with the same pressure as applied to form the first and second underlayer bonding members, it is less likely that one of the first semiconductor chip and the second semiconductor chip will be applied with a larger pressure. As a result, breakage of the one of the first semiconductor chip and the second semiconductor chip will be suppressed.

Embodiments of the present disclosure will be described with reference to the drawings, in which like or equivalent parts are designated with like reference numbers.

First Embodiment

A first embodiment will be described with reference to the drawings. A semiconductor device of the present embodiment includes a first support member 10, a first semiconductor chip 21, a second semiconductor chip 22, a first terminal 31, a second terminal 32, a second support member 40, and a molded resin 50. The semiconductor device further includes bonding members 101, 102, 111, 112, 121 and 122.

The first support member 10 has a surface 10a facing the second support member 40. The first support member 10 includes a plate-shaped member 11 and a first plating film 12 adjacent to the surface 10a. The plate-shaped member 11 has a plate shape and serves as a heat sink. The plate-shaped member 11 is, for example, made of copper (Cu). In the present embodiment, the first plating film 12 is provided by a NiAu plating film, which is less oxidized than a CoW plating film.

The first semiconductor chip 21 and the second semiconductor chip 22 are each made of silicon or silicon carbide (SiC), and formed with a semiconductor element, such as Metal Oxide Semiconductor Field Effect Transistor (MOSFET), Insulated Gate Bipolar Transistor (IGBT), or a diode element. The first semiconductor chip 21 has a front surface 21a and a back surface 21b each formed with an electrode pad, and is configured to allow an electric current between the front surface 21a and the back surface 21b. Likewise, the second semiconductor chip 22 has a front surface 22a and a back surface 22b each formed with an electrode pad, and is configured to allow an electric current between the front surface 22a and the back surface 22b. In the case where the semiconductor elements formed in the first semiconductor chip 21 and the second semiconductor chip 22 are MOSFETs or IGBTs, the front surfaces 21a and 22a are formed with gate pads to be joined with gate electrodes, and control terminals (not shown) are joined to the gate electrodes.

The first semiconductor chip 21 is disposed on the surface 10a of the first support member 10 through the first underlayer bonding member 101. The second semiconductor chip 22 is disposed on the surface 10a of the first support member 10 through the second underlayer bonding member 102. In other words, the first support member 10 is bonded to the first semiconductor chip 21 and the second semiconductor chip 22 as the first plating film 12 is bonded to the first underlayer bonding member 101 and the second underlayer bonding member 102. In the present embodiment, the first semiconductor chip 21 and the second semiconductor chip 22 have different thicknesses, which are dimensions between the front surfaces 21a and 22a and the back surfaces 21b and 22b. The thickness of the second semiconductor chip 22 is greater than the thickness of the first semiconductor chip 21.

The first terminal 31 has a block shape, and is made of copper or the like. The first terminal 31 is disposed adjacent to the front surface 21a of the first semiconductor chip 21 through a first medium layer bonding member 111. The second terminal 32 has a block shape, and is made of copper or the like. The second terminal 32 is disposed adjacent to the front surface 22a of the second semiconductor chip 22 through a second medium layer bonding member 112.

The second support member 40 has a surface 40a facing the first support member 10. The second support member 40 includes a plate-shaped member 41 and a second plating film 42 adjacent to the surface 40a, The plate-shaped member 41 has a plate shape and serves as a heat sink. The plate-shaped member 41 is, for example, made of copper (Cu). In the present embodiment, the second plating film 42 is provided by a CoW plating film, which contains CoW as a main component. According to the studying of the inventors of the present disclosure, it is appreciated that, when the concentration of W is 23 wt % or more relative to CoW, it is difficult to form as the plating film. In addition, according to the studying of the inventors of the present disclosure, it is appreciated that, when the concentration of W is 5 wt % or more relative to the CoW plating film, the plating film particularly achieves the high bonding property with the Ag sintered body and the molded resin. In the present embodiment, therefore, the second plating film 42 is provided by a CoW plating film in which the concentration of W is 5 to 23 wt %.

The second support member 40 is disposed such that the second plating film 42 is bonded to the first terminal 31 and the second terminal 32, respectively, through the first upper layer bonding member 121 and the second upper layer bonding member 122.

In the present embodiment, as described above, the thickness of the second semiconductor chip 22 is greater than that of the first semiconductor chip 21. Therefore, the second support member 40 is arranged such that the surface 40a is tilted relative to the surface 10a of the first support member 10. Also, the second upper layer bonding member 122 is disposed so as to expand toward side surfaces of the second terminal 32. For example, the second terminal 32 is generally a block having a rectangular parallelepiped shape. In such a case, the side surfaces of the second terminal 32 are surfaces that connect between the surface of the second terminal 32 facing the surface 10*a* of the first support member 10 and the surface 40*a* of the second support member 40.

The first and second underlayer bonding members 101 and 102, the first and second medium layer bonding members 111, 112, and the first and second upper layer bonding members 121, 122 are each provided by an Ag sintered body that is produced by sintering an Ag paste. Further, the first and second underlayer bonding members 101 and 102 and the first and second medium bonding members 111 and 112 are provided by pressurized sintered bodies that are produced by sintering the Ag paste in a pressurized state. On the other hand, the first and second upper layer bonding members 121 and 122 are provided by non-pressurized sintered bodies that are produced by sintering the Ag paste in a non-pressurized state. That is, the first plating film 12 is bonded to the first and second underlayer bonding members 101 and 102, which are pressurized sintered bodies, whereas the second plating film 42 is bonded to the first and second upper layer bonding members 121 and 122, which are non-pressurized sintered bodies.

Each of the bonding members 101, 102, 111, 112, 121, and 122 is configured as described above. The first and second underlayer bonding members 101 and 102 and the first and second underlayer bonding members 111 and 112 have smaller particle gaps between adjacent particles than those of the first and second upper layer bonding members 121 and 122. The particle gaps mean gaps defined between adjacent particles forming the sintered body.

The molded resin 50 is disposed so as to encapsulate the first and second semiconductor chips 21 and 22, the first and second terminals 31 and 32, the bonding members 101, 102, 111, 112, 121 and 122, and respective areas of the first and second support members 10 and 40 adjacent to the surfaces 10*a* and 40*a*. Further, the molded resin 50 is disposed such that the surfaces 10*b* and 40*b* of the first and second support members 10 and 40 are exposed from the molded resin 50.

The NiAu plating film providing the first plating film 12 and the CoW plating film providing the second plating film 42 have the following properties. The NiAu plating film and the CoW plating film both have high adhering property with the molded resin 50. Further, the NiAu plating film is less oxidized than the CoW plating film. However, the NiAu plating film has a lower bonding property with the Ag sintered body than the CoW plating film before being oxidized. In other words, the CoW plating film has a higher bonding property with the Ag sintered body than the NiAu plating film, before being oxidized, but the bonding property of the CoW plating film with the Ag sintered body is lowered due to oxidation.

Namely, in the present embodiment, the first plating film 12 and the second plating film 42 are each made of the material having a high adhering property with the molded resin 50. The material of the first plating film 12 is less oxidized than that of the second plating film 42. However, the material of the first plating film 12 has a lower bonding property with the Ag sintered body than the material of the second plating film 42 before being oxidized. The second plating film 42 is made of the material that has a higher bonding property with the Ag sintered body before being oxidized than the material of the first plating film 12.

The semiconductor device of the present disclosure has the configurations as described hereinabove. Next, a method for producing the semiconductor device will be described with reference to FIGS. 2A to 2G.

Figure 2A:
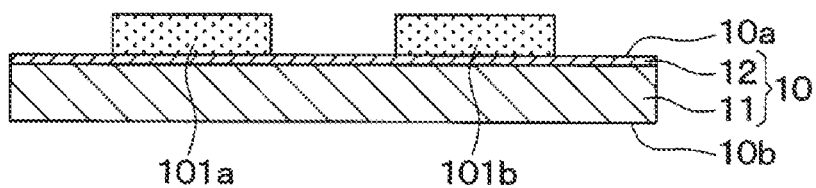
FIG. 2A is a diagram illustrating a cross-sectional view of a production step for producing the semiconductor device shown in FIG. 1.

As shown in FIG. 2A, a first support member 10 having a first plating film 12 at a surface 10*a* is prepared. The first plating film 12 is provided by a NiAu plating film. Then, a first underlayer paste 101*a* and a second underlayer paste 102*a* are applied onto the surface 10*a*. In this case, the first and second underlayer pastes 101*a* and 102*a* are made by mixing Ag particles into a solvent, such as alcohol or ethylene glycol. Ag pastes 111*a*, 112*a*, 121*a* and 122*a*, which will be described later, are similarly made by mixing Ag particles into a solvent such as alcohol or ethylene glycol.

Figure 2B:
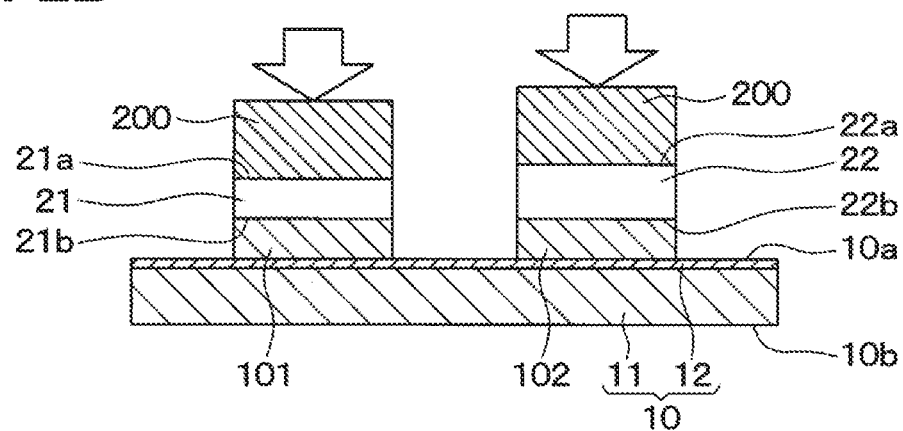
FIG. 2B is a diagram illustrating a cross-sectional view of a production step subsequent to the step shown in FIG. 2A.

As shown in FIG. 2B, a first semiconductor chip 21 is placed on the first underlayer Ag paste 101*a*, and a second semiconductor chip 22 is placed on the second underlayer Ag paste 102*a* to form a stacked body. Then, pressure is applied to the first semiconductor chip 21 and the second semiconductor chip 22 from the front surfaces 21*a* and 22*a* with a pressuring device 200, and the stacked body is heated while being applied with the pressure. Thus, the first underlayer Ag paste 101*a* is sintered with pressure. That is, the first underlayer bonding member 101 is formed by pressure-sintering the first underlayer Ag paste 101*a*. Likewise, the second underlayer Ag paste 102*a* is sintered with pressure. That is, the second underlayer bonding member 102 is formed by pressure-sintering the second underlayer Ag paste 102*a*.

In this case, the first underlayer bonding member 101 and the second underlayer bonding member 102 are formed by the pressure-sintering, i.e., sintered in a pressurized state. Therefore, the bonding property of the first plating film 12 with the first and second underlayer bonding members 101 and 102 is enhanced, as compared with a case where the first and second underlayer bonding members 101 and 102 are formed by sintering without pressure, that is, by non-pressurized sintering. Since the first and second underlayer bonding members 101 and 102 are pressurized-sintered bodies that are formed by pressurizing and heating. Therefore, inside the sintered bodies, gaps between adjacent particles are relatively small.

Figure 2C:
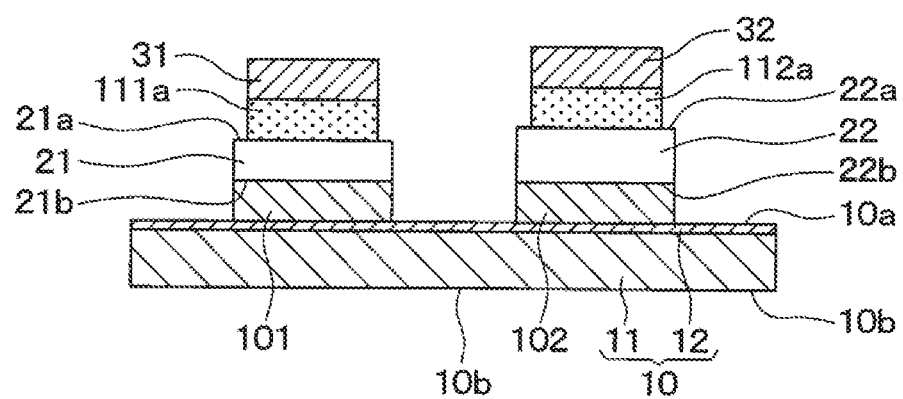
FIG. 2C is a diagram illustrating a cross-sectional view of a production step subsequent to the step shown in FIG. 2B

As shown in FIG. 2C, a first medium Ag paste 111*a* is placed on the front surface 21*a* of the first semiconductor chip 21, and a first terminal 31 is placed on the first medium Ag paste 111*a*. Likewise, a second medium Ag paste 112*a* is placed on the front surface 22*a* of the second semiconductor chip 22, and a second terminal 32 is placed on the second medium Ag paste 112*a*.

As shown in FIG. 2D, pressure is applied to the stacked body from the front surfaces 21*a* and 22*a* of the first and second semiconductor chips 21 and 22 with a pressuring device 200, and the stacked body is heated while being applied with the pressure, similarly to the step shown in FIG. 2B. Thus, the first medium layer Ag paste 111*a* is sintered with pressure. That is, the first medium layer bonding member 101 is formed by pressure-sintering the first medium layer Ag paste 111*a*. Likewise, the second medium layer Ag paste 112*a* is sintered with pressure. That is, the second medium layer bonding member 112 is formed by pressure-sintering the second underlayer Ag paste 112*a*. In this case, since the first and second medium layer bonding members 111 and 112 are pressurized-sintered bodies that are formed by pressurizing and heating. Therefore, in the sintered bodies, gaps between adjacent particles are relatively small.

As shown in FIG. 2E, a first upper layer Ag paste 121*a* is placed on the first terminal 31, and a second upper layer Ag paste 121*b* is placed on the second terminal 32.

As shown in FIG. 2F, a second support member 40 having a second plating film 42 adjacent to a surface 40a is prepared. The second plating film 42 is provided by a CoW plating film. Then, the second support member 40 is placed over the first and second upper layer Ag pastes 121a and 122a such that the surface 40a of the second support member 40 faces the surface 10a of the first support member 10 and is in contact with the first and second upper layer Ag pastes 121a and 122a.

Thereafter, the stacked body prepared in the step shown in FIG. 2F is heated, without being pressurized, so as to sinter the first upper layer Ag pastes 121a and 122a. Thus, the first upper layer Ag paste 121a is sintered to be a first upper layer bonding member 121, and the first upper layer Ag paste 122a is sintered to be a second upper layer bonding member 122. In this case, the second plating film 42 is provided by the CoW plating film that exerts a high bonding property with the Ag sintered body even without being pressurized. Thus, the second plating film 42 can be in a highly bonded state with the first upper layer bonding member 121 and the second upper layer bonding member 122.

As described above, the thickness of the second semiconductor chip 22 is greater than the first semiconductor chip 21. When the second support member 40 is placed, the weight of the second support member 40 is more likely applied to the second upper layer Ag paste 122a on the second semiconductor chip 22 than to the first upper layer Ag paste 121a. Therefore, the second upper layer Ag paste 122a spreads over the side surfaces of the second terminal 32, hence the second upper layer bonding member 122 is made in a state covering the side surfaces of the second terminal 32. In this case, however, the second support member 40 is not in a perfect parallel with the surface 10a of the first support member 10, but is in an inclined state relative to the surface 10a of the first support member 10.

The first and second upper layer bonding members 121 and 122 are non-pressurized sintered bodies, which are made by sintering without being pressurized through a pressuring device 200 or the like. That is, the first and second upper layer bonding members 121 and 122 are low-pressure sintered bodies, which are made by sintering in a state of lower pressure than the first and second underlayer bonding members 101 and 102. Therefore, inside of the sintered bodies of the first and second upper layer bonding members 121 and 122, the size of the gaps between the adjacent particles is relatively large.

Figure 2G:
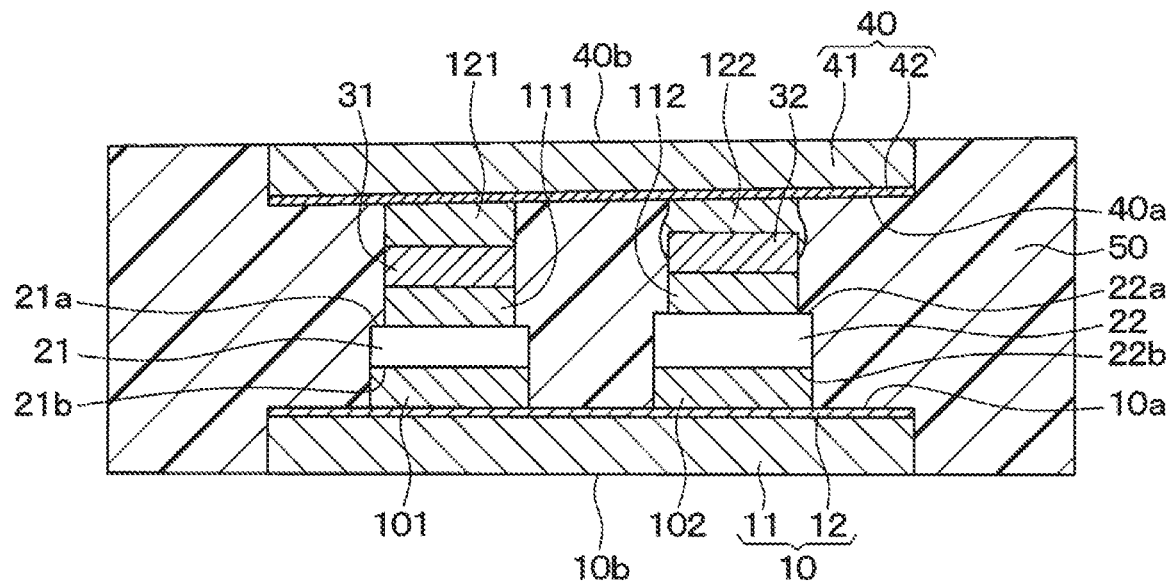
FIG. 2G is a diagram illustrating a cross-sectional view of a production step subsequent to the step shown in FIG. 2F.

The inventors of the present disclosure has studied on a heating temperature of the above step, and found that Co begins to be oxidized when heated at 280 degrees Celsius (° C.) or more. In the present embodiment, therefore, the heating temperature is kept less than 280° C. That is, the heating temperature is set to a temperature at which Co of the second plating film 42 is hardly oxidized. As shown in FIG. 2G, the stacked body produced up to the step shown in FIG. 2F is placed in a molding die (not shown), and a molded resin 50 is formed by a transfer molding technique or the like. Thus, the semiconductor device shown in FIG. 1 is produced.

In the present embodiment, the first underlayer Ag paste 101a and the second underlayer Ag paste 102a respectively correspond a first underlayer Ag sintering material and a second underlayer Ag sintering material. The first upper layer Ag paste 121a and the second upper layer Ag paste 122a respectively correspond a first upper layer Ag sintering material and a second upper layer Ag sintering material.

In the present embodiment, as described above, the first and second underlayer bonding members 101 and 102 and the first and second upper layer bonding members 121 and 122 are sintered bodies, and the gaps defined between the particles of the sintered bodies of the first and second underlayer bonding members 101 and 102 are smaller than those of the first and second upper layer bonding members 121 and 122. In other words, the first and second underlayer bonding members 101 and 102 are pressurized sintered bodies that are produced by applying the pressure greater than that applied to produce the first and second upper layer bonding members 121 and 122. The first and second upper layer bonding members 121 and 122 are provided by non-pressurized sintered bodies.

Although the first plating film 12 has a lower bonding property with the Ag sintered body than the second plating film 42 before being oxidized, since the first and second underlayer bonding members 101 and 102 are the pressurized sintered bodies, the first plating film 12 can enhance the bonding property with the first and second underlayer bonding members 101 and 102. The second plating film 42 is provided by the CoW plating film that has a high bonding property with the Ag sintered body even without being pressurized. The second plating film 42 is not affected by the thermal treatment that is performed for bonding the first support member 10 and the first and second underlayer bonding members 101 and 102. Therefore, it is less likely that the second plating film 42 will be oxidized. Also, it is less likely that the bonding property between the second plating film 42 and the first and second upper layer bonding members 121 and 122 will be degraded. In addition, since the oxidation of the second plating film 42 is suppressed, it is less likely that the adhering property between the second plating film 42 and the molded resin 50 will be degraded.

The first plating film 12 is made of the material that is less oxidized than the material of the second plating film 42. Therefore, the first plating film 12 is hardly oxidized during the producing process of the semiconductor device, and it is less likely that the bonding property between the first plating film 12 and the first and second underlayer bonding members 101 and 102 will be degraded. Further, since the first plating film 12 is hardly oxidized, it is less likely that the adhering property of the first plating film 12 with the molded resin 50 will be degraded.

The first plating film 12 and the second plating film 42 are made of the materials that have high adhering properties with the molded resin 50. Therefore, the semiconductor device of the present embodiment can achieve the enhancement of the bonding property between the second plating film 42 and the first and second upper layer bonding members 121 and 122 as well as the enhancement of the bonding properties between the first plating film 12 and the first and second underlayer bonding members 101 and 102 and between the first plating film 12 and the molded resin 50. In other words, in the semiconductor device of the present embodiment, the bonding properties between the first and second plating films 12 and 42 and the first and second underlayer bonding members 101 and 102 and first and second upper layer bonding members 121 and 122 and the adhering property between the first and second plating films 12 and 42 and the molded resin 50 are compatible.

The first and second upper layer bonding members 121 and 122 are provided by the non-pressurized sintered body. Therefore, it is less likely that the first semiconductor chip 21 or the second semiconductor chip 22 will receive an excessive pressure. As such, breakage of the first semiconductor chip 21 or the second semiconductor chip 22 will be suppressed.

The first and second upper layer bonding members 121 and 122 are made from the first and second upper layer Ag pastes 121a and 122a by the thermal treatment at the temperature lower than 280° C. Therefore, it is less likely that Co will be oxidized when the first and second upper layer bonding members 121 and 122 are formed, and hence the degradation of the bonding property between the second plating film 42 and the first and second upper layer bonding members 121 and 122 can be suppressed.

As described above, the semiconductor device has the CoW plating film and the Ag sintered bodies, which have high thermal resistances. Therefore, the semiconductor device of the present embodiment effectively achieves the effects in a module integrating SiC devices, which is expected to be operated at a high temperature range.

Other Embodiments

While only the exemplary embodiment has been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

In the first embodiment described hereinabove, the first support member 10 and the second support member 40 may be provided by any substrate, such as a direct bonded copper (DBC) substrate or an active metal brazed copper (AMC) substrate.

In the first embodiment described hereinabove, the semiconductor device may not have the first and second terminals 31 and 32 and the first and second medium layer bonding members 111 and 112. That is, in such a semiconductor device, the front surface 21a of the first semiconductor chip 21 may be bonded to the second support member 40 through the first upper layer bonding member 121 and the front surface 22a of the second semiconductor chip 22 may be bonded to the second support member 40 through the second upper layer bonding member 122.

In the first embodiment described hereinabove, the first semiconductor chip 21 and the second semiconductor chip 22 may have the same thickness. Even if the first semiconductor chip 21 and the second semiconductor chip 22 have the same thickness, there may be a possibility that the height of the region including the first semiconductor chip 21 and the height of the region including the second semiconductor chip 22 be different due to parts tolerance or production errors. In the case where the first upper layer Ag paste 121a and the second upper layer Ag paste 122a are sintered in a non-pressurized state, similarly to the first embodiment, the advantageous effects similar to those of the first embodiment can be achieved.

In the first embodiment described hereinabove, the first and second upper layer Ag pastes 121a and 122a may be applied, in the step shown in FIG. 2F, with a pressure that is lower than the pressure applied to the first and second underlayer Ag pastes 101a and 102a in the step shown in FIG. 2B. That is, the first and second upper layer bonding members 121 and 122 may be each provided by a low-pressurized sintered body. Also in such a production process, it is less likely that the second semiconductor chip 22 will be applied with an excessive pressure, and breakage of the second semiconductor chip 22 is thus suppressed, as compared to the case where the same pressure as that applied to the step shown in FIG. 2B is applied in the step shown in FIG. 2F.

Figure 3:
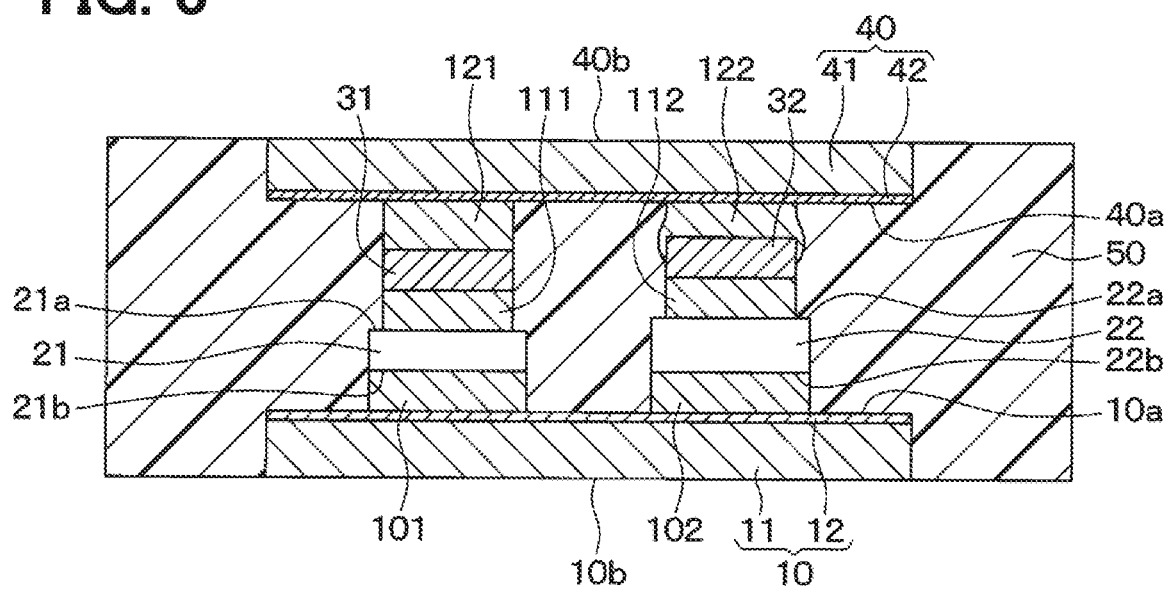
FIG. 3 is a diagram illustrating a cross-sectional view of a semiconductor device according to another embodiment of the present disclosure.

In the first embodiment described hereinabove, in the step shown in FIG. 2F, the second support member 40 may be kept using a jig (not shown) such that the surface 40a of the second support member 40 is parallel to the surface 10a of the first support member 10. Then, in such a state, the first and second upper layer Ag bonding members 121, 122 may be formed and the molded resin 50 may be arranged, as shown in FIG. 3.

In the first embodiment described hereinabove, the first plating film 12 may not be formed. Also in such a semiconductor device, the first and second underlayer bonding members 101 and 102 are provided by the pressurized sintered bodies. Therefore, the bonding property between the first support member 10 and the first and second underlayer bonding members 101 and 102 can be enhanced, as compared with the case where the first and second underlayer bonding members 101 and 102 are provided by the non-pressurized sintered bodies.

In the first embodiment described hereinabove, in place of the first and second underlayer Ag pastes 101a and 102a, first and second underlayer Ag sheets may be used for the sintering materials. Likewise, first and second upper layer Ag sheets may be used as the sintering materials, in place of the first and second upper layer Ag pastes 121a and 122a. Moreover, first and second medium layer Ag sheets may be used as the sintering materials, in place of the first and second medium layer Ag pastes 111a and 112a.

In the first embodiment described hereinabove, the first and second medium layer bonding members 111 and 112 may be provided by non-pressurized sintered bodies or low-pressurized sintered bodies.

In the first embodiment described hereinabove, a primer resin may be disposed between the molded resin 50 and other components 10 to 40, 101, 102, 111, 112, 121 and 122 for enhancing an adhering property with the molded resin 50. The primer resin may be applied after the step shown in FIG. 2F and before the step shown in FIG. 2G.

What is claimed is:
1. A semiconductor device comprising:
a first support member;
a second support member facing the first support member;
a first semiconductor chip disposed between the first support member and the second support member;
a second semiconductor chip disposed between the first support member and the second support member;
a first underlayer bonding member disposed between the first support member and the first semiconductor chip;
a second underlayer bonding member disposed between the first support member and the second semiconductor chip;
a first upper layer bonding member disposed between the second support member and the first semiconductor chip; and
a second upper layer bonding member disposed between the second support member and the second semiconductor chip, wherein
the first underlayer bonding member, the second underlayer bonding member, the first upper layer bonding member and the second upper layer bonding member are, respectively, provided by silver sintered bodies, and
the silver sintered bodies of the first and second underlayer bonding members have gaps between adjacent particles, and the gaps of the silver sintered bodies of the first and second underlayer bonding members are smaller in size than those of the silver sintered bodies of the first and second upper layer bonding members, the first and second underlayer bonding members are bonded with the first support member, the second support member has a plating film on a surface facing the first support member, and the plating film of the second support member contains cobalt tungsten as a main component, and is bonded with the first and second upper layer bonding members.

2. The semiconductor device according to claim 1, wherein the first support member has a plating film on a surface facing the second support member, and the plating film of the first support member is made of a material that is less oxidized than the plating film of the second support member, and is bonded with the first and second underlayer bonding members.

3. The semiconductor device according to claim 1, wherein the plating film of the first support member contains nickel cold as a main component.

4. A method for producing a semiconductor device, comprising:

preparing a first support member having a surface;

placing a first underlayer silver sintering material and a second underlayer silver sintering material on the surface of the first support member;

placing a first semiconductor chip on the surface of the first support member through the first underlayer silver sintering material and a second semiconductor chip on the first surface of the first support member through the second underlayer silver sintering material, to thereby provide a stacked body;

forming a first underlayer bonding member and a second underlayer bonding member, respectively, from the first underlayer silver sintering material and the second underlayer silver sintering material by heating and pressuring the stacked body, the first underlayer bonding member and the second underlayer bonding member being bonded to the first support member;

placing a first upper layer silver sintering material on the first semiconductor chip and a second upper layer silver sintering material on the second semiconductor chip;

preparing a second support member having a surface;

placing the second support member such that the surface of the second support member is in contact with the first upper layer silver sintering material and the second upper layer silver sintering material; and forming a first upper layer bonding member and a second upper layer bonding member, respectively, from the first upper layer silver sintering material and the second upper layer silver sintering material, the first upper layer bonding member and the second upper layer bonding member being bonded to the second support member, wherein the preparing of the second support member includes preparing the surface of the second support member with a plating film that contains cobalt tungsten as a main component, and the forming of the first upper layer bonding member and the second upper layer bonding member includes heating and applying a pressure that is lower than a pressure applied in the forming of the first underlayer bonding member and the second underlayer bonding member.

5. The method according to claim 4, wherein the preparing of the first support member includes preparing the surface of the first support member with a plating film that is made of a material less oxidized than the plating film of the second support member.

6. The method according to claim 5, wherein the preparing of the first support member includes preparing the surface of the first support member with a plating film that contains nickel gold as a main component.

7. The method according to claim 4, wherein the forming of the first upper layer bonding member and the second upper layer bonding member includes heating at a temperature lower than 280 degrees Celsius.

* * * * *